United States Patent
Ghosh et al.

(10) Patent No.: US 9,223,910 B1
(45) Date of Patent: Dec. 29, 2015

(54) PERFORMANCE AND MEMORY EFFICIENT MODELING OF HDL PORTS FOR SIMULATION

(71) Applicant: Xilinx, Inc., San Jose, CA (US)

(72) Inventors: Ishita Ghosh, Kolkata (IN); Saikat Bandyopadhyay, Kolkata (IN); Kumar Deepak, San Jose, CA (US); Hem C. Neema, Sunnyvale, CA (US); David K. Liddell, Longmont, CO (US)

(73) Assignee: XILINX, INC., San Jose, CA (US)

( * ) Notice: Subject to any disclaimer, the term of this patent is extended or adjusted under 35 U.S.C. 154(b) by 73 days.

(21) Appl. No.: 14/159,855

(22) Filed: Jan. 21, 2014

(51) Int. Cl.
  *G06F 17/50* (2006.01)

(52) U.S. Cl.
  CPC .................. *G06F 17/5009* (2013.01)

(58) Field of Classification Search
  CPC ............ G06F 17/5045; G06F 17/5022; G06F 17/505; G06F 8/41; G06F 19/00
  USPC .......................................... 716/104, 116–117
  See application file for complete search history.

(56) References Cited

U.S. PATENT DOCUMENTS

| | | | |
|---|---|---|---|
| 6,466,898 B1 * | 10/2002 | Chan ............................... | 703/17 |
| 6,751,583 B1 * | 6/2004 | Clarke ................ | G06F 17/5022 |
| | | | 703/17 |
| 8,838,431 B1 * | 9/2014 | Mihalache et al. ............. | 703/15 |

* cited by examiner

*Primary Examiner* — Nghia Doan
(74) *Attorney, Agent, or Firm* — LeRoy D. Maunu

(57) ABSTRACT

A method for compiling an HDL specification for simulation of a circuit design is disclosed. The circuit design is elaborated from the HDL specification and memory locations are allocated for formals and actuals of the elaborated circuit design. For each port having a formal and an actual that are compatible, the allocating of memory locations sets a reference pointer for the formal and a reference pointer for the actual to reference a same one of the memory locations. For each port having a formal and an actual that are incompatible, the allocating of memory locations sets the reference pointer for the formal and the reference pointer for the actual to reference different respective ones of the memory locations. Simulation code modeling the elaborated circuit design is generated that updates a formal and actual of a port that are compatible using a single write operation to the referenced memory location.

20 Claims, 7 Drawing Sheets

PERFORMANCE AND MEMORY EFFICIENT MODELING OF HDL PORTS FOR SIMULATION

TECHNICAL FIELD

The disclosure generally relates to the simulation of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through modules of combinatorial logic from one set of registers to another set of registers. HDLs provide a rich set of constructs to describe the functionality of a module. Modules may be combined and augmented to form even higher-level modules.

Prior to implementation, an HDL-based design can be simulated to determine whether or not the design will function as required. Wasted manufacturing costs due to faulty design may thereby be avoided. Numerous tools are available for simulating circuit designs including, for example, high-level modeling systems (HLMS) and HDL simulators. Simulation of an HDL-based design comprises a compilation phase and a runtime simulation phase. In the compilation phase, input HDL source code is elaborated and executable simulation code is generated. In the runtime simulation phase, the code generated in the compilation phase is executed by a simulation engine to simulate the design.

From a user perspective, HDL simulators work by compiling the HDL-based design once, and then executing the compiled design many times during the runtime phase. Therefore, the runtime performance of HDL simulators is of critical importance, and may be more important than compile time performance.

An HDL-based design is a hierarchy of module instances whose behavior is described by HDL processes. Each port of a module instance includes an actual expression (referred to herein as an "actual") and a formal object (referred to herein as a "formal"). The actual is used as a reference to specify connections of the port with other module instances of the HDL-based design. The formal is used to describe connections with various components within the module. For ease of reference, the formal and actual of a port may be respectively referred to as port connections or connections.

HDL simulators schedule execution of HDL statements such that global variables or signals input to the HDL statements are properly updated and race conditions between concurrent HDL statements are avoided. Simulation of HDL processes is performed over a number of simulation cycles. Each simulation cycle begins with updates to values of connections. Each connection, which may be a VHDL signal or a Verilog net/variable represents values transmitted on a wire of a circuit design. For ease of reference, VHDL signals and Verilog nets may be referred to as either signals or nets, and such terms are used interchangably herein. Each update to a connection may trigger a number of processes which model how a hardware implementation of the design would respond. Processes dependent on the updated connections are scheduled and executed in a delta cycle.

SUMMARY

A method for compiling an HDL specification for simulation of a circuit design is disclosed. Using one or more processors, the circuit design is elaborated from the HDL specification and memory locations are allocated for formals and actuals of the elaborated circuit design. For each port of the elaborated circuit design having a formal and an actual that are compatible, the allocating of memory locations sets a reference pointer for the formal and a reference pointer for the actual to reference a same one of the memory locations. For each port of the elaborated circuit design having a formal and an actual that are incompatible, the allocating of memory locations sets the reference pointer for the formal and the reference pointer for the actual to reference different respective ones of the memory locations. Simulation code that models the elaborated circuit design is generated. During simulation runtime, for each set of a formal and an actual with reference pointers that reference the same one of the memory locations, the simulation code updates the formal and the actual using a single write operation to the referenced memory location.

A second method for compiling an HDL specification for simulation of a circuit design is also disclosed. Using one or more processors, memory locations are allocated for formals and actuals of the elaborated circuit design. As part of the allocation, compatibility of the formal and the actual of each port is determined. In response to determining whether the formal and actual of the port are compatible, reference pointers of the formal and the actual are set to reference a same one of the memory locations. In response to determining that the formal and the actual of the port are incompatible, reference pointers of the formal and the actual are set to reference different respective ones of the memory locations. Simulation code that models the elaborated circuit design is generated. During simulation runtime, for each set of a formal and an actual with reference pointers that reference the same one of the memory locations, the simulation code updates the formal and the actual using a single write operation to the referenced memory location.

A system is also disclosed. The system includes a compiler for generating simulation code to model a circuit design and a simulator for executing the generated simulation code. The compiler is configured to elaborate the circuit design from an HDL specification and allocate memory locations for formals and actuals of the elaborated circuit design. The allocation of memory locations includes, for each port of the elaborated circuit design having a formal and an actual that are compatible, setting a reference pointer for the formal and a reference pointer for the actual to reference a same one of the memory locations. The allocation of memory locations also includes, for each port of the elaborated circuit design having a formal and an actual that are incompatible, setting the reference pointer for the formal and the reference pointer for the actual to reference different respective ones of the memory locations. The compiler is also configured to generate simulation code that models the elaborated circuit design. During simulation runtime, for each set of a formal and an actual with reference pointers that reference the same one of the memory locations, the simulation code updates the formal and the actual using a single write operation to the referenced memory location.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Methods and systems are disclosed for efficient compilation and simulation of a circuit described in an HDL specification. Previous methods for simulation of HDL circuit designs allocate separate memory locations for the formal and actual of each port, with no regard to the connection type or size of the formals and actuals. As a result, simulation code generated by these processes may require significantly large amounts of memory and computation time to simulate the port connections of an HDL design. In some of the disclosed compilation processes, memory is allocated for the formal and actual of each port based on compatibilty of the actual and the formal of the port. More specifically, for each port having a compatible formal and actual, a single memory location is allocated and references to the formal and the actual are set to reference the single memory location. For each port having a formal and an actual that are incompatible, the formal and actual are set to reference different allocated memory locations. Using this approach, less memory is required for simulation in comparison to previous compilation methods, which allocate separate memory locations for the formal and actual of each port of the HDL specification.

Executable simulation code for updating signal values of formals and actuals during simulation may also be generated on a port by port basis based on the compatibilty of the actual and the formal of the port. As indicated above, a formal and an actual of a port that are compatible are set to reference the same memory location. In some embodiments, rather than using separate update functions for each actual and formal, compatible actuals and formals are updated using a single update function. In this manner, the number of update operations is reduced and simulation runtime is improved in comparison to the previous compilation methods.

In this manner, both computation and memory resources required at simulation runtime are reduced. The additional compilation time imposed by this approach is offset by gains in runtime performance since HDL-based designs are typically simulated many times following compilation. The envisioned embodiments are applicable to circuit designs written in VHDL, Verilog, or a combination of VHDL and Verilog. For ease of reference, the Examples are primarily described with reference to System Verilog which includes net-type connections (e.g., System Verilog wires) and variable-type connections (e.g., System Verilog reg and bit).

Figure 1:
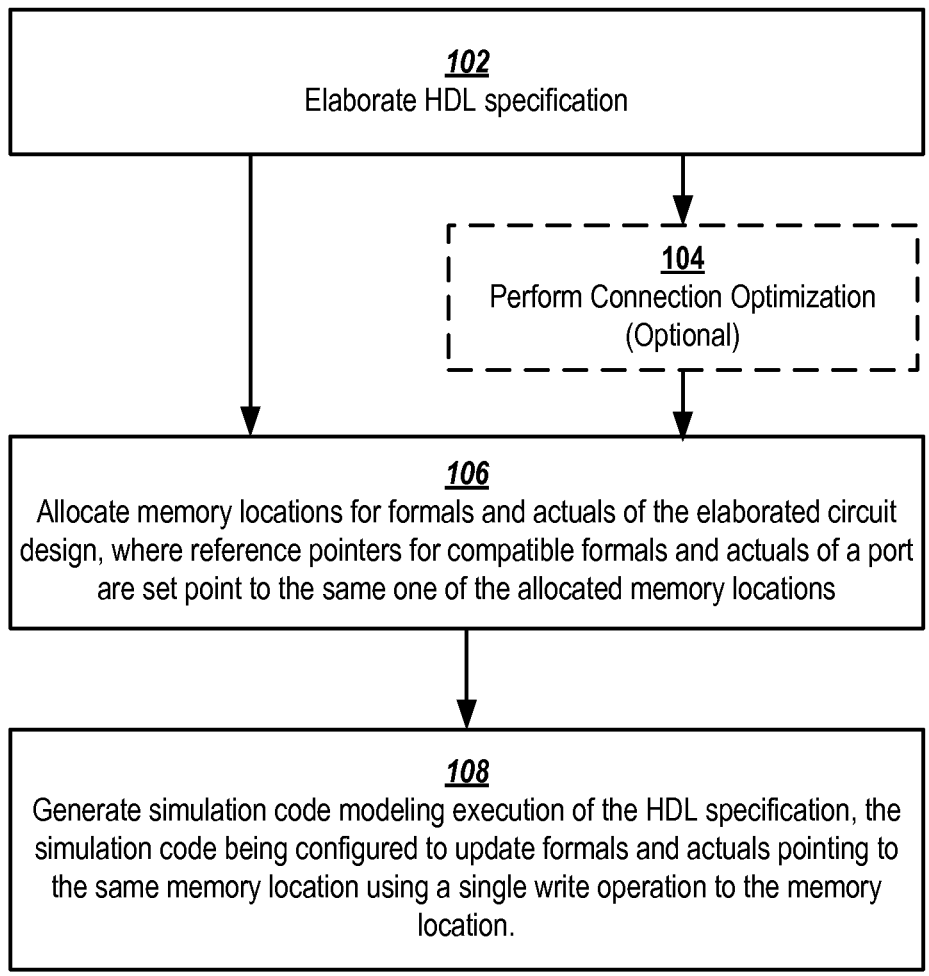
FIG. 1 shows a process for compiling an HDL specification for simulation.

Turning now to the figures, FIG. 1 shows a flowchart of a process for compiling an HDL specification to produce an executable simulation model. An HDL specification is elaborated at block 102. During elaboration, a parse tree data structure is constructed that includes a respective node for each instance of a module in the HDL specification. Connections between nodes of the parse tree represent port connections between the module instances. The parse tree data structure may describe characteristics of the formal and the actual of each port including, for example, type and/or size of the formal and actual. Using the characteristics indicated by the parse tree data structure, compatibility between each pair of an actual and formal may be determined.

Memory locations are allocated for formals and actuals of the elaborated circuit design at block 106. The memory locations are used to store values of signals propagated by the formals and actuals during simulation runtime. If the formal and the actual of a port are compatible, a single memory location is used to store the value of both the formal and the actual. Otherwise, separate memory locations are allocated to store a signal value in the two respective formats of the formal and the actual.

At block 108, simulation code is generated that models execution of the HDL specification. At simulation runtime, the simulation code updates the values of formals and actuals in response to changes in the values of other formals or actuals connected thereto in the circuit design.

For each port having a formal and an actual that are compatible, the generated simulation code includes a single update function configured to update the formal and actual of the port using a single write operation to the single memory location referenced by the formal and actual. For each port having a formal and an actual that are incompatible, the generated simulation code includes a respective update function for each of the formal and actual. Each update function is configured to update a respective one of the formal and the actual of a port. For instance, in response to a change in value of the formal, the update function of the actual converts the value of the formal from the format of the formal to the format of the actual and updates the value of the actual with the new value. Conversely, in response to a change in value of the actual, the update function of the formal converts the value of the actual from the format of the actual to the format of the formal and updates the value of the formal with the new value.

In some implementations, some connections may also be optimized, at block 104, prior to the allocation of memory at block 106 to remove some incompatibilities. For instance, a singly-driven net type connection does not require a value to be resolved from multiple sources, and can be represented using a 2-state variable-type connection. In some embodiments, singly driven net type connections are identified at block and converted to 2-state variable type connections at block 104.

Figure 2:
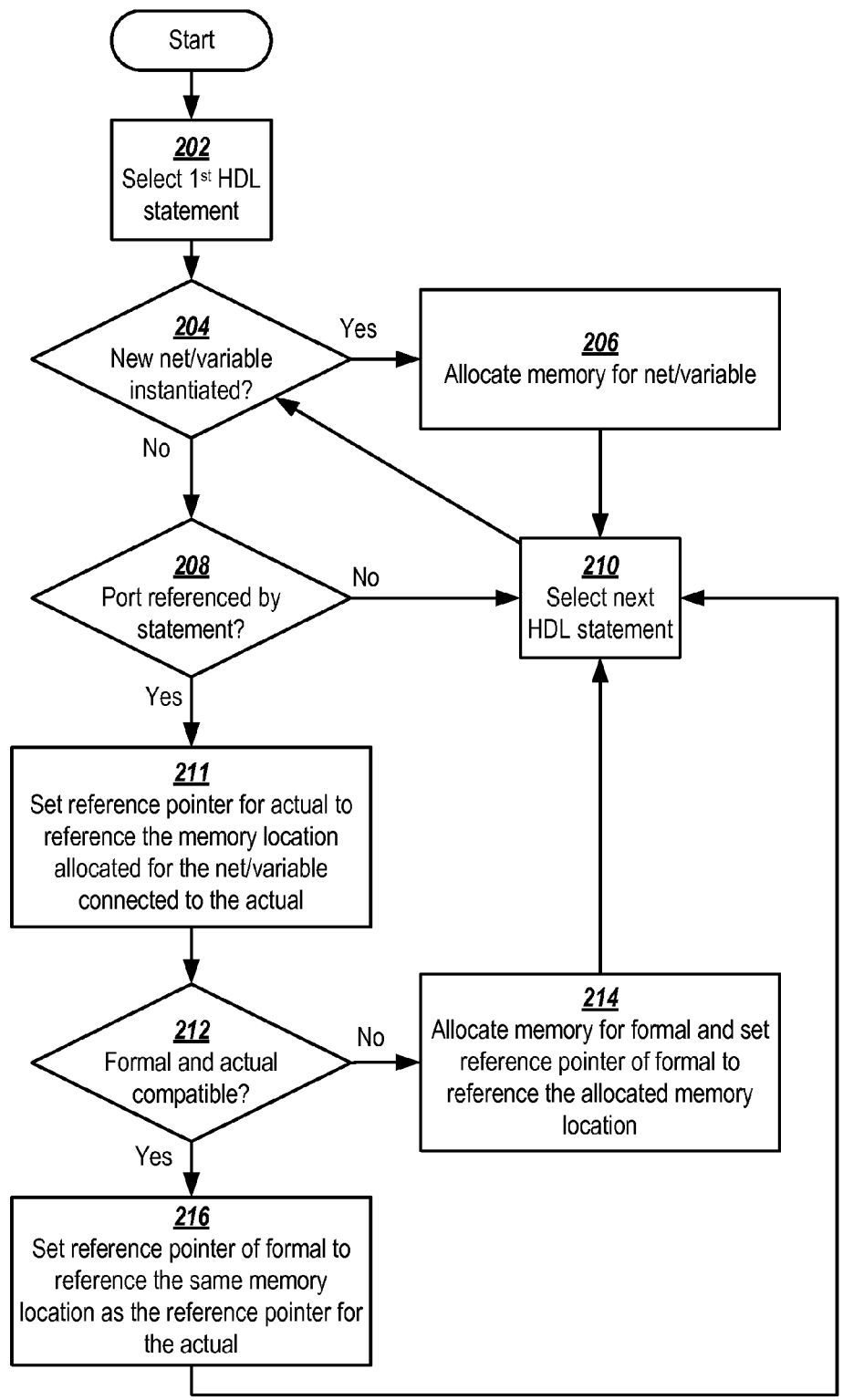
FIG. 2 shows a process for allocating memory for formals and actuals of a circuit design for simulation.

FIG. 2 shows a process for allocating memory for formals and actuals of a circuit design for simulation. The manner in which memory is allocated for the formal and actual of a port depends on whether or not the formal and the actual have compatible formats. The HDL specification is traversed starting at block 202. Traversal of the HDL specification may be performed by stepping through the HDL specification line by line starting at the top-level module of the HDL specification. The first HDL statement of the specification is selected at block 202. The selected statement is evaluated at decision blocks 204, 208, and 212 to direct allocation of memory for any formal or actual referenced by the selected statement. Alternatively, a parse tree representing an elaborated HDL specification may be traversed starting at the top-level node in the parse tree and the ports at each node evaluated.

One or more statements in the HDL specification may instantiate a new net-type or variable-type connection in a module, for example, by declaring a net-type wire, or a variable-type reg/bit that is subsequently input to a port of a module. If a new net-type or variable-type connection is instantiated by the statement, decision block 204 directs the process to block 206 to allocate memory for the connection. The next statement is then selected at block 210 and the evaluation is repeated at decision blocks 204, 208, and 212.

If a new net-type or variable-type connection is not instantiated by the selected statement, decision block 204 directs the process to decision block 208. If the selected HDL statement does not reference a port, the next statement is selected at block 210 and the evaluation is repeated at decision blocks 204, 208, and 212. Otherwise, if the selected HDL statement references a port, decision block 208 directs the process to block 211 where a reference pointer for the actual of the port is set to reference the memory location allocated for the net-type or variable-type connection assigned to the actual. At decision block 212, compatibility of the formal and actual of the port is evaluated. If the formal and actual of the referenced port are compatible, the reference pointer of the formal is set to reference the same memory location as the reference pointer of the actual at block 216. Otherwise, a new memory location is allocated for the formal at block 214 and the reference pointer for the formal is set to reference the allocated memory location. After the reference pointer of the formal is set at blocks 214 or 216, the next statement is selected at block 210 and the evaluation is repeated at decision blocks 204, 208, and 212. This process is repeated until each HDL statement in the specification is evaluated.

Figure 3:
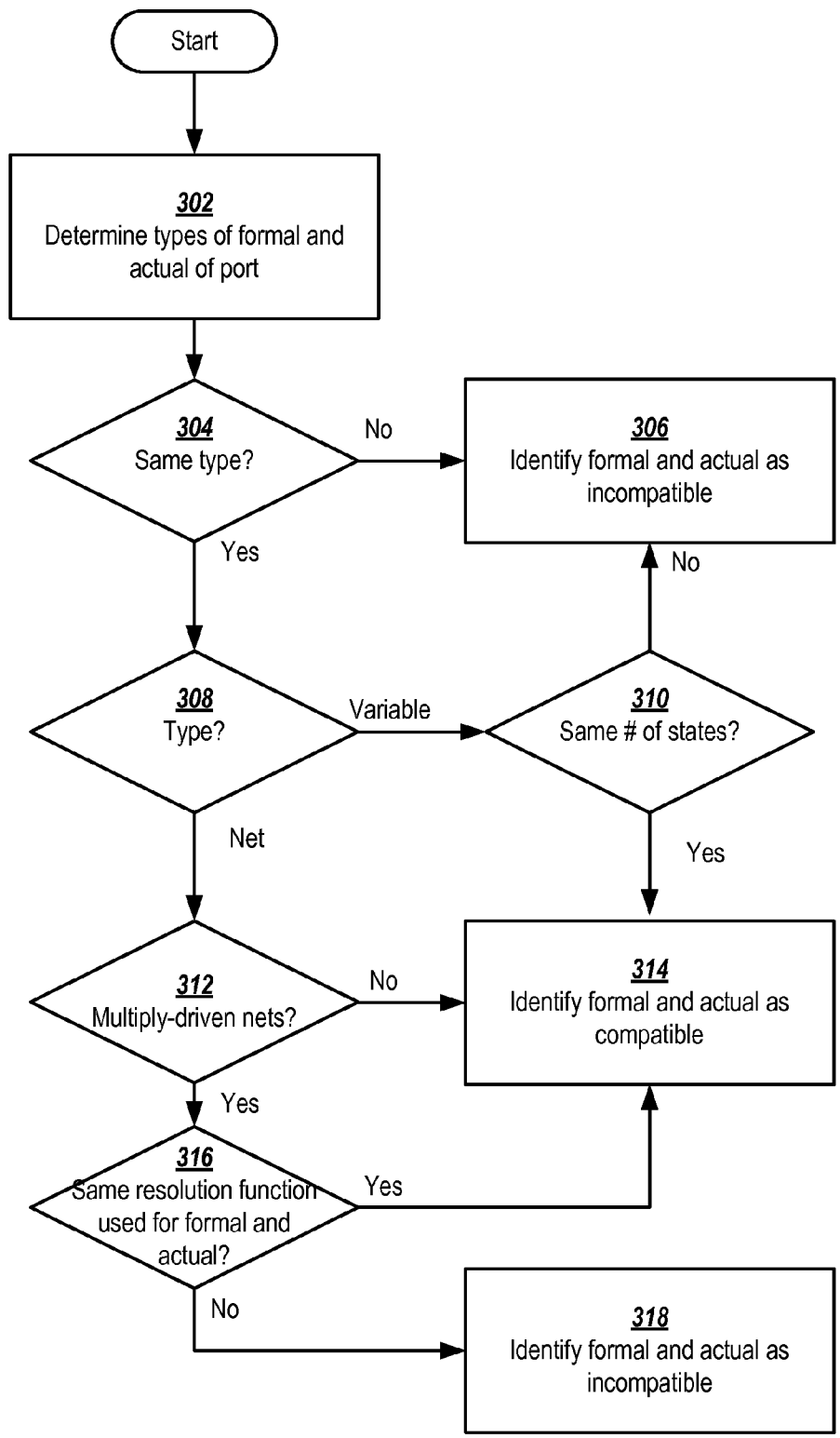
FIG. 3 shows a process for determining compatibility of a formal and an actual of a port.

FIG. 3 shows a process for determining compatibility of a formal and an actual of a port. At block 302, the types of the formal and the actual of the port are determined. For instance, each formal and actual may be either a variable-type (e.g., a System Verilog register) or a net-type (e.g., a System Verilog wire). If the formal and actual are not the same type, decision block 304 directs the process to identify the formal and the actual as incompatible at block 306.

Otherwise, if the formal and the actual are both variable type, decision block 308 directs the process to evaluate the number of variable states at decision block 310. A variable-type connection may be a 2-state connection having two possible values or a 4-state connection having 4 possible values. If the variable-type formal and the variable-type actual have the same number of states, decision block 310 directs the process to identify the formal and the actual as compatible at block 314. Otherwise, if the variable-type formal and the variable-type actual have different numbers of states, decision block 310 directs the process to identify the formal and the actual as incompatible at block 306.

If the formal and the actual are both net type, decision block 308 directs the process to evaluate the number of drivers of the net-type formal and net-type actual at decision block 312. Net-type formal and actual connections may be singly-driven by a single driver or may be multiply-driven by multiple drivers. For a multiply-driven net-type connection, a value of the net-type connection is determined at runtime using a resolution function. The resolution function determines a resolved value based on values of all of the drivers of the multiply-driven net-type connection. If the formal and the actual are both singly-driven nets, decision block 312 directs the process to identify the formal and the actual as compatible at block 314. Otherwise, if the nets are driven by multiple drivers, the resolution functions used to resolve the values of the multiple drivers to a resolved value are evaluated. If both of the nets use the same resolution function, decision block 316 directs the process to identify the formal and the actual as compatible at block 314. Otherwise, decision block 316 directs the process to identify the formal and the actual as incompatible at block 318.

Compatibility of port formals and actuals may be determined at various times in the compilation process. In some implementations, compatibility may be determined after elaboration of the HDL specification, while allocating memory and generating simulation code. In some other embodiments, the compatibility may be determined while elaborating the HDL specification. For instance, a parse tree data structure generated during elaboration may store data for each port indicating whether or not the formal and the actual of the port are compatible. The stored data may be used at a later time to allocate memory and generate simulation code for formals and actuals as a function of compatibility of the formal and actual of each port.

Figure 4:
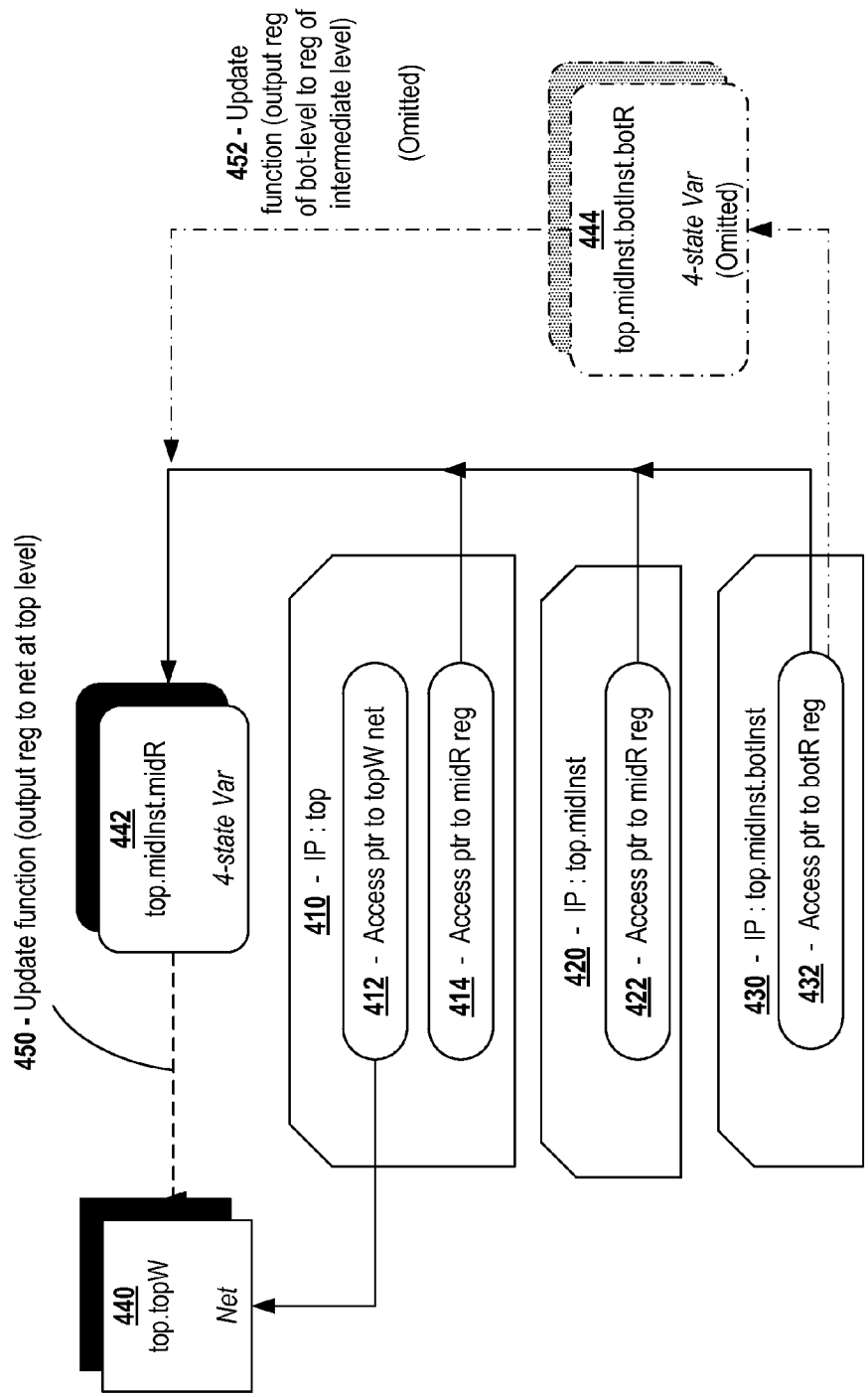
FIG. 4 shows allocation of memory locations for a first example HDL code segment.

FIG. 4 shows an example memory layout for data objects of the code segment shown in Example 1. In this example, a net-type connection topW is created in the top-level module top 410. A memory location is allocated for topW in the design memory space. Reference pointer 412 for topW in the top-level module top 410 is set to reference the allocated memory location 440. The instruction mid midInst(topW) requires a port having the net-type connection topW as an actual and a 4-state variable-type connection midR of the module instance midInst 420 as a formal. As there is a mismatch of type between the actual and the formal of the port, a new memory location 442 is allocated and reference pointers 414 and 422 for the actual midR are set to reference the new memory location 442. An update function (represented by dotted line 450) is also created in the generated simulation code for converting and propagating updated values between the memory location 442 for midR and memory location 440 for topW.

```
module top;
    wire topW;
    mid midInst(topW);
    initial begin
        $monitor($time, "Value: topW % b midInst.midR % b
            midInst.botInst.botR % b"
            , topW, midInst.midR, midInst.botInst.botR);
    end
endmodule
module mid(output reg midR); // output reg port at intermediate level bot botInst(midR);
endmodule
module bot(output reg botR);
    initial begin
        botR=1'b1;
        #3 botR=1'b0;
        #3 botR=1'b1;
    end
endmodule
```

EXAMPLE 1

The mid module definition in Example 1 includes an instruction bot botInst(midR), which creates a module instance botInst 430. BotInst 430 includes a port having the 4-state variable-type connection midR as the actual and a 4-state variable-type connection botR as the formal. Previous compilation methods would allocate a new memory location

444 for the formal and set a corresponding reference pointer 432 to reference the new memory location 444. A second update function (represented by dotted line 452) would also be created in the previous compilation methods for propagating updated signal values information between the memory location 444 for botR and the memory location 442 for midR.

In contrast to the previous approaches, the disclosed methods do not allocate new memory location 444 or require a creation of a respective update function. Rather, the compilation processes recognize that the formal botR is compatible with the actual midR, and sets the reference pointer for the formal botR 432 to also reference the memory location 442 allocated for the actual midR of the port. As a result, when the formal botR is updated inside module instance botInst 430, memory location 442 is updated, which effectively updates the actual midR as well. The update to the botR/midR memory location 442 then triggers the update function to convert the value having a first format of the variable-type connection to a second format of the net-type connection and store the converted value in memory location 440.

As the memory location 444 is not required to be allocated by the disclosed compilation processes, simulation memory requirements are reduced. Further, as botR and midR are updated at the same time without use of respective update functions to propagate an updated value between botR and midR computational requirements of the simulation are also reduced.

Figure 5:
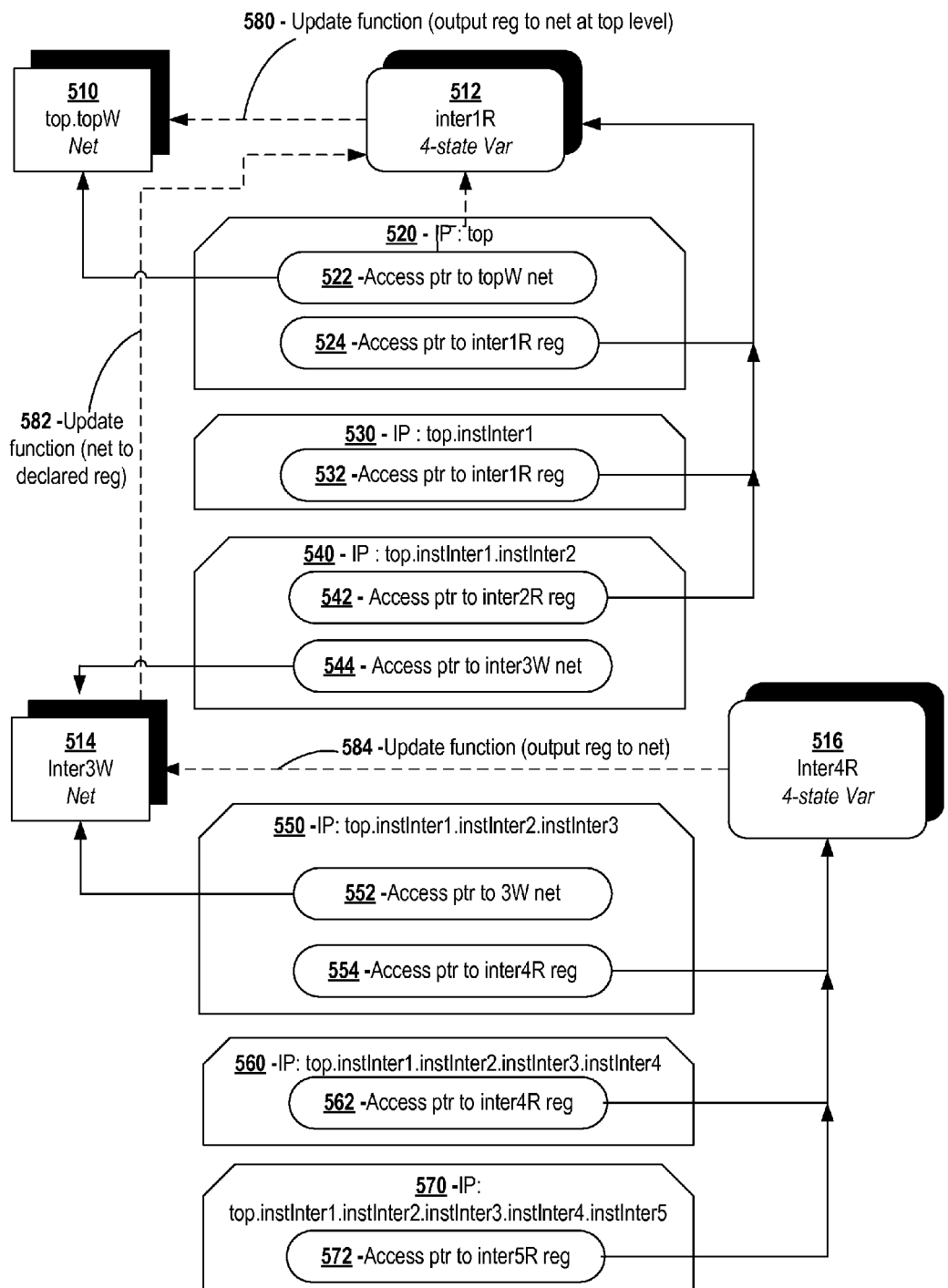
FIG. 5 shows allocation of memory locations for a second example HDL code segment.

FIG. 5 shows an example memory layout for data objects of the code segment shown in Example 2. In this example, a net-type connection topW is created in the top-level module top 520. A memory location 510 is allocated for this net topW in the design memory space. Reference pointer 522 for topW in the top-level module top 520 is set to reference the allocated memory location 510.

```
module top;
    wire [2:0] topW;
    inter1 instInter1(topW);
    assign #2 topW[2]=1'b0;
    initial begin
        $monitor($time, "the value topW % b", topW);
    end
endmodule
module inter1(output reg [2:0] inter1R);
    inter2 instInter2(inter1R);
    initial begin
        #3 $display($time, "the value inter1R % b", inter1R);
    end
endmodule
module inter2(output reg [2:0] inter2R);
    inter3 instInter3(inter2R);
endmodule
module inter3(output wire [2:0] inter3W);
    inter4 instInter4(inter3W);
    assign inter3W=3'b110;
endmodule
module inter4(output reg [2:0] inter4R);
    inter5 instInter5(inter4R);
endmodule
module inter5(output reg [2:0] inter5R);
    initial begin
        #1 inter5R=3'b101;
    end
endmodule
```

EXAMPLE 2

The instruction inter1 instInter1(topW) creates module instance instInter1 530, which requires a port having the net-type connection topW as an actual and a 4-state variable-type connection Inter1R as a formal. In this case, the connection types of the actual and the formal of the port are different and thus are not compatible. A new memory location 512 is allocated for the 4-state variable-type connection Inter1R and reference pointers 524 and 532 are set to reference the new memory location 512. An update function (represented by dotted line 580) is also created for converting and propagating updated values between the 512 and 510 memory locations.

The inter1 module definition in Example 2 includes an instruction inter2 instInter2(inter1R), which creates module instance instInter2 540. The module instance instInter2 540 includes a port having the 4-state variable-type connection inter1R as the actual and a 4-state variable-type connection inter2R as the formal. As the formal and actual of the port are the same connection type, a new memory location does not need to be allocated for the formal of the port. Rather, the reference pointer 542 for the formal inter2R is set to reference the same memory location 512 as the reference pointer 532 for the actual inter1R.

The inter2 module definition in Example 2 includes an instruction inter3 instInter3(inter2R), which creates module instance instInter3 550. The module instance instInter3 550 includes a port having the 4-state variable-type connection inter2R as the actual and a net-type connection inter3W as the formal. As the formal and actual of the port are different connection types, a new memory location 514 is allocated for the formal of the port. Reference pointers 544 and 552 for the formal inter3W are set to reference the new memory location 514 and an update function (represented by dotted line 582) is created to convert and propagate updated signal values between the memory locations 514 and 512.

The inter3 module definition in Example 2 includes an instruction inter4 instInter4(inter3W), which creates module instance instInter4 560. The module instance instInter4 560 includes a port having the net-type connection inter3W as the actual and a 4-state variable-type connection inter4R as the formal. As the formal and actual of the port are different connection types, a new memory location 516 is allocated for the formal of the port. Reference pointers 554 and 562 for the formal inter4R are set to reference the new memory location 516 and an update function (represented by dotted line 584) is created to convert and propagate updated signal values between the memory locations 516 and 514.

The inter4 module definition in Example 2 includes an instruction inter5 instInter5(inter4R), which creates module instance instInter5 570. The module instance instInter5 570 includes a port having the 4-state variable-type connection inter4R as the actual and a 4-state variable-type connection inter5R as the formal. As the formal and actual of the port are the same connection type, a new memory location does not need to be allocated for the formal of the port. Rather, the reference pointer 572 for the formal inter5R is set to reference the same memory location 516 as the reference pointer 562 for the actual inter4R.

Figure 6:
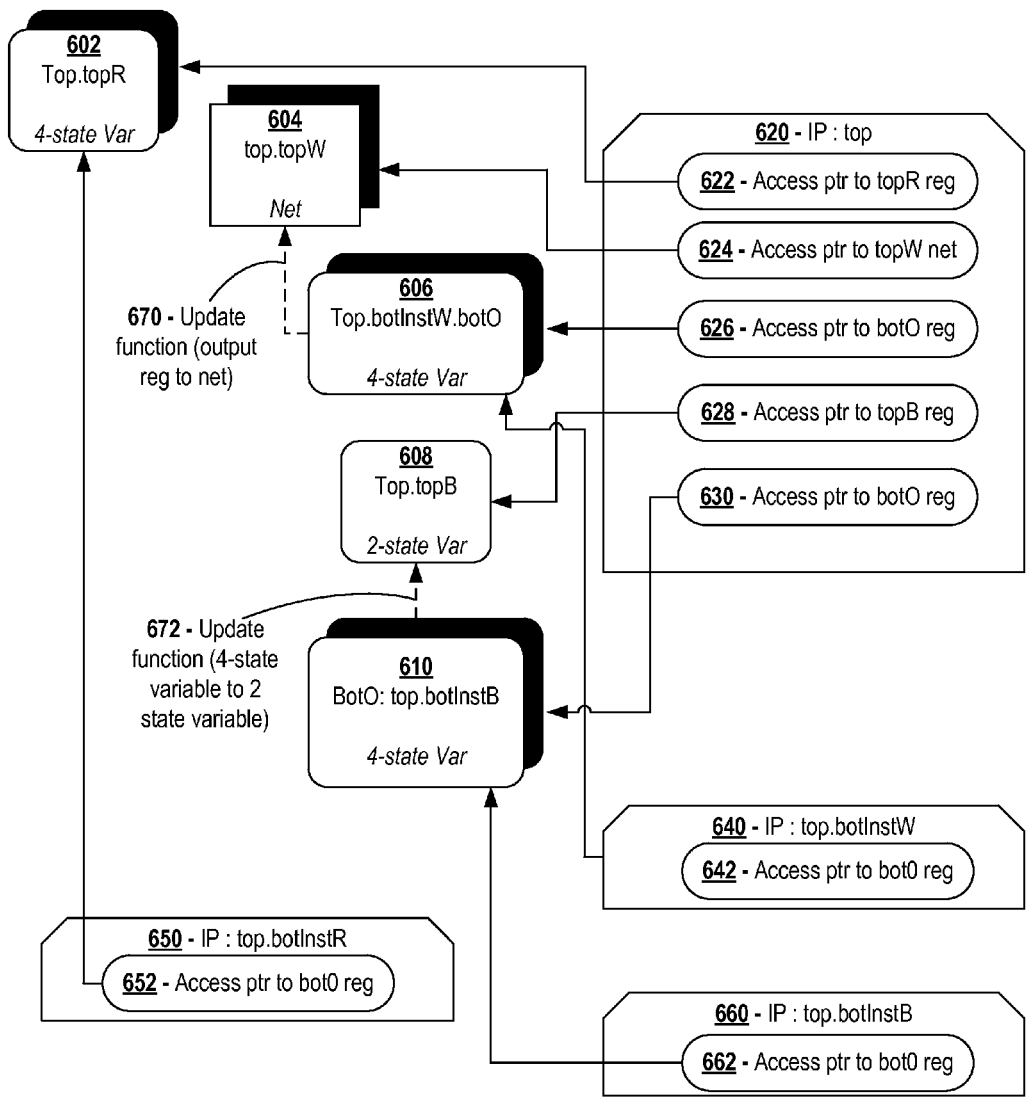
FIG. 6 shows allocation of memory locations for a third example HDL code segment.

FIG. 6 shows an example memory layout for data objects of the code segment shown in Example 3. In this example, a 4-state variable-type connection topR, a net-type connection topW, and a 2-state variable connection topB are created in the top-level module top 620. Memory locations 602, 604, and 608 are allocated, and reference pointers 622, 624, and 628 for the respective connections topR, topW, and topB are set to reference the respective memory locations 602, 604, and 608.

The instruction bot botInstR(topR) in Example 3 creates a first module instance botInstR 650 of the module bot. The module instance botInstR 650 includes a port having the 4-state variable-type connection topR as an actual and a 4-state variable-type connection botO as a formal. As the connection types of the actual and the formal of the port are the same, a reference pointer 652 for the formal is set to reference the same memory location 602 as the reference pointer 622 for the actual.

```
module top;
    reg topR;
    wire topW;
    bit topB;
    bot botInstR(topR);
    bot botInstW(topW);
    bot botInstB(topB);
    initial begin
        $monitor($time, "Value: topR % b topW % b topB %
            b botInstR.botO % b botInstW.botO % b botInstB-
            .botO % b",
            topR, topW, topB, botInstR.botO, botInstW.botO,
                botInstB.botO);
    end
endmodule
module bot(output logic botO);
    initial begin
        botO=1'b1;
        #3 botO=1'bx;
        #3 botO=1'b1;
    end
endmodule
```

EXAMPLE 3

The instruction bot botInstW(topW) in Example 3 creates a second module instance botInstW 640 of the module bot. The module instance botInstW 640 includes a port having the net-type connection topW as an actual and a 4-state variable-type connection botO as a formal. As the connection types of the actual and the formal of the port are different, a new memory location 606 is allocated for the formal and reference pointers 626 and 642 for the formal are set to reference the new memory location 606. An update function (represented by dotted line 670) is also created to convert and propagate updated signal values between the memory locations 606 and 604.

The instruction bot botInstB(topB) in Example 3 creates a third module instance botInstB 660 of the module bot. The module instance botInstB 660 includes a port having the 2-state variable-type connection topB as an actual and a 4-state variable-type connection botO as a formal. As the connection types of the actual and the formal of the port are different sizes (2-state and 4-state), a new memory location 610 is allocated for the 4-state formal and reference pointers 630 and 662 for the formal are set to reference the new memory location 610. An update function (represented by dotted line 672) is also created to convert and propagate updated signal values between the memory locations 610 and 608.

Figure 7:
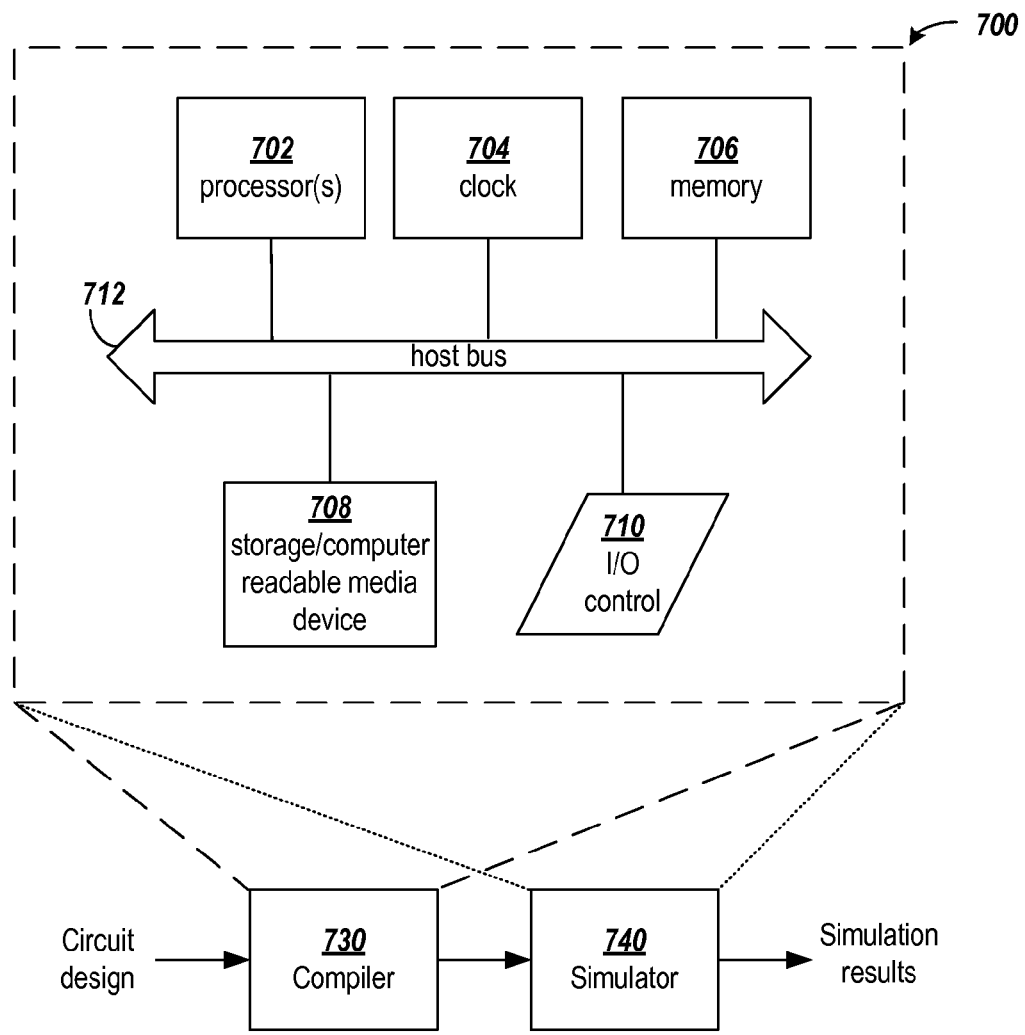
FIG. 7 shows a computing arrangement that may be configured to implement the processes disclosed herein.

FIG. 7 shows a block diagram of an example computing arrangement 700 that may be configured to implement the compilation and/or simulation processes described herein. In some implementations, the computing arrangement 700 may be first configured to implement a compiler 730 that generates simulation code modeling an input circuit design. The computing arrangement 700 may then be reconfigured to implement a simulator 740 that executes the generated simulation code modeling the circuit design to produce simulation results.

It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory unit 706, a storage unit 708, and an input/output control unit 710 coupled to a host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 702 may be one or more general purpose processors, or a combination of one or more general purpose processors and suitable co-processors, or one or more specialized processors (e.g., RISC, CISC, pipelined, etc.).

The memory 706 typically includes multiple levels of cache memory, and a main memory. The storage arrangement 708 may include local and/or remote persistent storage, such as provided by magnetic disks (not shown), flash, EPROM, or other non-volatile data storage. The storage unit may be read or read/write capable. Further, the memory 706 and storage 708 may be combined in a single arrangement.

The processor 702 executes the software in storage 708 and/or memory 706 units, reads data from and stores data to the storage 708 and/or memory 706 units, and communicates with external devices through the input/output control unit 710. These functions are synchronized by the clock signal generator 704. The resource of the computing arrangement may be managed by either an operating system (not shown), or a hardware control unit (not shown).

The embodiments may be applicable to a variety of systems for HDL compilation and simulation. Other aspects and embodiments will be apparent from consideration of the specification. It is intended that the specification and illustrated embodiments be considered as examples only, with a true scope of the embodiments being indicated by the following claims.

What is claimed is:

1. A method of compiling a hardware description language (HDL) specification for simulation of a circuit design, the method comprising:
   using one or more processors, performing operations including:
   elaborating the circuit design from the HDL specification;
   allocating memory locations for formals and actuals of the elaborated circuit design, the allocating of memory locations including:
      for each port of the elaborated circuit design having a formal and an actual that are compatible, setting a reference pointer for the formal and a reference pointer for the actual to reference a same one of the memory locations; and
      for each port of the elaborated circuit design having a formal and an actual that are incompatible, setting the reference pointer for the formal and the reference pointer for the actual to reference different respective ones of the memory locations; and generating simulation code that models the elaborated circuit design, the simulation code configured and arranged to, during simulation runtime, for each set of a formal and an actual having reference pointers that reference the same one of the memory locations and in response to a call to an update function corresponding to the set, update the formal and the actual of the set using a single write operation to the same memory location referenced by the reference pointers of the formal and the actual, thereby using fewer computation and memory resources during simulation runtime in comparison to a set of a formal and an actual having incompatible reference pointers.

2. The method of claim 1, wherein the allocating of memory locations for formals and actuals of the circuit design includes:

traversing the elaborated circuit design;

in response to encountering, in the traversal, an HDL statement that instantiates a connection, allocating a respective one of the memory locations for the connection; and in response to encountering, in the traversal, an HDL statement indicating a port:

setting a reference pointer for an actual of the port to reference the respective one of the memory locations allocated for a connection assigned to the actual by the HDL statement;

in response to the formal and the actual of the port having compatible sizes and types, setting the reference pointer for the formal to reference the same one of the memory locations as the reference pointer for the actual; and in response to the formal and the actual of the port having incompatible sizes and types, allocating a respective one of the memory locations and setting the reference pointer for the formal to reference the respective one of the memory locations.

3. The method of claim 2, wherein the allocating of memory locations for formals and actuals of the circuit design further includes:

in further response to encountering a port having a formal with a reference pointer that does not reference one of the memory locations, determining if the formal and the actual of the port are compatible by:

determining whether each of the formal and the actual of the port is a variable type or net type; and in response to the formal and the actual of the port being different types, identifying the formal and the actual as incompatible.

4. The method of claim 3, further comprising, in response to determining that the formal and the actual of the port are the variable type:

determining whether each of the formal and actual of the port is a 2-state variable or a 4-state variable;

in response to determining the formal and actual of the port both to be 2-state variables or both to be 4-state variables, identifying the formal and the actual as compatible; and in response to determining one of the formal and the actual to be a 2-state variable and the other one of the formal and actual to be a 4-state variable, identifying the formal and the actual as incompatible.

5. The method of claim 3, further comprising, in response to the determining the formal and the actual of the port to be the net type:

determining whether the formal and the actual of the port are singly-driven or are multiply-driven;

in response to the formal and the actual of the port being singly-driven, identifying the formal and the actual as compatible;

in response to the formal and the actual of the port being multiply-driven and the formal having a resolution function equivalent to a resolution function of the actual, identifying the formal and the actual as compatible; and in response to the formal and the actual of the port being multiply-driven and the formal having a resolution function that is different from a resolution function of the actual, identifying the formal and the actual as incompatible.

6. The method of claim 1, further comprising, prior to the allocating memory locations for the actuals and the formals of the ports, identifying actuals that are a net type and are singly driven, and changing the identified actuals to a 2-state variable type.

7. The method of claim 1, wherein the allocating of memory locations includes traversing the elaborated circuit design and for each port encountered in the traversal determining whether or not the port has a formal and an actual that are compatible.

8. The method of claim 1, wherein:

the elaborating of the circuit design includes:

generating a parse tree of the circuit design, wherein each module instance of the circuit design is represented by a respective parse node in the parse tree; and in each node in the parse tree, storing data indicating whether or not each port of the module instance has a formal and an actual that are compatible; and the allocating of memory locations is performed as a function of the stored data indicating whether or not each port of the module instance has a formal and an actual that are compatible.

9. A method of compiling a hardware description language (HDL) specification for simulation of a circuit design, comprising:

using one or more processors, performing operations including:

allocating memory locations for formals and actuals of the elaborated circuit design by performing operations including, for each port of the circuit design:

determining whether or not a formal and an actual of the port are compatible;

in response to determining the formal and actual of the port are compatible, setting the reference pointers of the formal and the actual to reference a same one of the memory locations; and in response to determining the formal and actual of the port are incompatible, setting the reference pointers of the formal and the actual to reference different respective ones of the memory locations; and generating simulation code that models the elaborated circuit design, the simulation code configured and arranged to, during simulation runtime, for each set of a formal and an actual having reference pointers that reference the same one of the memory locations and in response to a call to an update function corresponding to the set, update the formal and the actual of the set using a single write operation to the same memory location referenced by the reference pointers of the formal and the actual, thereby using fewer computation and memory resources during simulation runtime in comparison to a set of a formal and an actual having incompatible reference pointers.

10. The method of claim 9, wherein the determining whether or not a formal and an actual of the port are compatible includes:
   determining whether each of the formal and the actual of the port is a variable type or net type; and
   in response to the formal and the actual of the port being different ones of the variable and net types, identifying the formal and the actual as incompatible.

11. The method of claim 10, wherein the determining whether or not a formal and an actual of the port are compatible further includes, in response to determining that the formal and the actual of the port are the variable type:
   determining whether each of the formal and actual of the port is a 2-state variable or a 4-state variable;
   in response to determining the formal and actual of the port both to be 2-state variables or both to be 4-state variables, identifying the formal and the actual as compatible; and
   in response to determining one of the formal and the actual to be a 2-state variable and the other one of the formal and actual to be a 4-state variable, identifying the formal and the actual as incompatible.

12. The method of claim 10, wherein the determining whether or not a formal and an actual of the port are compatible further includes, in response to the determining the formal and the actual of the port to be the net type:
   in response to the formal and the actual of the port being singly-driven, identifying the formal and the actual as compatible;
   in response to the formal and the actual of the port being multiply-driven and the formal having a resolution function equivalent to a resolution function of the actual, identifying the formal and the actual as compatible; and
   in response to the formal and the actual of the port being multiply-driven and the formal having a resolution function that is different from a resolution function of the actual, identifying the formal and the actual as incompatible.

13. The method of claim 9, wherein the allocating of memory locations for formals and actuals of the circuit design further includes:
   traversing the elaborated circuit design;
   in response to encountering, in the traversal, an HDL statement that instantiates a net-type or variable type connection, allocating a respective one of the memory locations; and
   in response to encountering, in the traversal, an HDL statement indicating a port, setting the reference pointer of the actual to reference the respective one of the memory locations allocated for a connection assigned to the actual by the HDL statement, and performing the determination whether or not the formal and the actual of the port are compatible.

14. The method of claim 9, further comprising, prior to the allocating memory locations for the actuals and the formals of the ports:
   elaborating the circuit design from the HDL specification;
   identifying actuals that are a net type and are singly driven; and
   changing the identified actuals to a 2-state variable type.

15. The method of claim 9, wherein the allocating of memory locations includes traversing the elaborated circuit design and for each port encountered in the traversal determining whether or not the port has a formal and an actual that are compatible.

16. The method of claim 9, further comprising, prior to the allocating memory locations for the actuals and the formals of the ports, elaborating the circuit design from the HDL specification, the elaborating including:
   generating a parse tree of the circuit design, wherein each module instance of the circuit design is represented by a respective parse node in the parse tree;
   in each node in the parse tree, storing data indicating whether or not each port of the module instance has a formal and an actual that are compatible.

17. A system, comprising:
   a computing arrangement configured with a compiler and a simulator, wherein the compiler is configured and arranged to:
      elaborate a circuit design from an HDL specification;
      allocate memory locations for formals and actuals of the elaborated circuit design by performing operations including:
         for each port of the elaborated circuit design having a formal and an actual that are compatible, setting a reference pointer for the formal and a reference pointer for the actual to reference a same one of the memory locations; and
         for each port of the elaborated circuit design having a formal and an actual that are incompatible, setting the reference pointer for the formal and the reference pointer for the actual to reference different respective ones of the memory locations; and
      generate simulation code that models the elaborated circuit design, the simulation code configured and arranged to, during simulation runtime, for each set of a formal and an actual having reference pointers that reference the same one of the memory locations and in response to a call to an update function corresponding to the set, update the formal and the actual of the set using a single write operation to the same memory location referenced by the reference pointers of the formal and the actual, thereby using fewer computation and memory resources during simulation runtime in comparison to a set of a formal and an actual having incompatible reference pointers; and
   wherein the simulator is configured and arranged to simulate the circuit design of the HDL specification by executing the generated simulation code.

18. The system of claim 17, wherein the compiler is configured and arranged to, for each port of the circuit design:
   determine whether each of the formal and the actual of the port is a variable type or net type; and
   in response to the formal and the actual of the port being different ones of the variable and net types, identify the formal and the actual as incompatible.

19. The system of claim 18, wherein the compiler is configured and arranged to, in response to determining that the formal and the actual of the port are the variable type:
   determine whether each of the formal and actual of the port is a 2-state variable or a 4-state variable;
   in response to determining the formal and actual of the port both to be 2-state variables or both to be 4-state variables, identify the formal and the actual as compatible; and
   in response to determining one of the formal and the actual to be a 2-state variable and the other one of the formal and actual to be a 4-state variable, identify the formal and the actual as incompatible.

20. The system of claim 19, wherein the compiler is configured and arranged to, in response to the determining the formal and the actual of the port to be the net type:

in response to the formal and the actual of the port being singly-driven, identify the formal and the actual as compatible;

in response to the formal and the actual of the port being multiply-driven and the formal having a resolution function equivalent to a resolution function of the actual, identify the formal and the actual as compatible; and in response to the formal and the actual of the port being multiply-driven and the formal having a resolution function that is different from a resolution function of the actual, identify the formal and the actual as incompatible.

\* \* \* \* \*